(12) United States Patent
Wu

(10) Patent No.: US 11,527,680 B2
(45) Date of Patent: Dec. 13, 2022

(54) ULTRAVIOLET LIGHT-EMITTING DIODE CHIP AND METHOD FOR MAKING THE SAME

(71) Applicant: Jiangxi Zhao Chi Semiconductor Co., Ltd., Nanchang (CN)

(72) Inventor: Liangwen Wu, Nanchang (CN)

(73) Assignee: JIANGXI ZHAO CHI SEMICONDUCTOR CO., LTD., Nanchang (CN)

( * ) Notice: Subject to any disclaimer, the term of this patent is extended or adjusted under 35 U.S.C. 154(b) by 180 days.

(21) Appl. No.: 17/019,335

(22) Filed: Sep. 13, 2020

(65) Prior Publication Data

US 2020/0411726 A1 Dec. 31, 2020

Related U.S. Application Data

(63) Continuation-in-part of application No. PCT/CN2019/094986, filed on Jul. 8, 2019.

(30) Foreign Application Priority Data

Jul. 12, 2018 (CN) .......................... 201810765845.8
Jul. 12, 2018 (CN) .......................... 201821104745.2

(51) Int. Cl.
 *H01L 33/32* (2010.01)
 *H01L 33/46* (2010.01)
(Continued)

(52) U.S. Cl.
 CPC .......... *H01L 33/46* (2013.01); *H01L 33/0075* (2013.01); *H01L 33/0093* (2020.05);
(Continued)

(58) Field of Classification Search
 CPC . H01L 33/0075; H01L 33/0093; H01L 33/32; H01L 33/46; H01L 33/06;
(Continued)

(56) References Cited

U.S. PATENT DOCUMENTS 6,869,820 B2 * 3/2005 Chen ....................... H01L 33/46
 257/E33.068
7,691,656 B2 * 4/2010 Bader .................. H01L 33/405
 257/E33.068
(Continued)

*Primary Examiner* — Savitri Mulpuri
(74) *Attorney, Agent, or Firm* — Matthias Scholl P.C.; Matthias Scholl

(57) ABSTRACT

An ultraviolet light-emitting diode chip, including: a n-type semiconductor layer; an intermediate layer disposed on the n-type semiconductor layer, the intermediate layer including a plurality of first tapered pits; an active layer disposed on the intermediate layer; a p-type semiconductor layer disposed on the active layer; a n-type electrode disposed on the n-type semiconductor layer; a p-type electrode disposed on the p-type semiconductor layer; a reflecting layer; a bonding layer; and a substrate. The reflecting layer and the bonding layer are disposed between the p-type electrode and the substrate. The active layer includes a plurality of second tapered pits each in a shape of hexagonal pyramid and a plurality of first flat regions connecting every two adjacent second tapered pits. The projected area of the plurality of first flat regions is less than 30% of the projected area of the active layer.

23 Claims, 5 Drawing Sheets

(51) Int. Cl.
*H01L 33/00* (2010.01)
*H01L 33/06* (2010.01)
*H01L 33/24* (2010.01)

(52) U.S. Cl.
CPC .............. *H01L 33/06* (2013.01); *H01L 33/24* (2013.01); *H01L 33/32* (2013.01); *H01L 2933/0025* (2013.01)

(58) Field of Classification Search
CPC ..... H01L 33/007; H01L 33/24; H01L 33/405; H01L 2933/025
See application file for complete search history.

(56) References Cited

U.S. PATENT DOCUMENTS

| | | | |
|---|---|---|---|
| 8,318,519 B2* | 11/2012 | Doan | H01L 33/0093 438/33 |
| 10,134,960 B2* | 11/2018 | Scholz | H01L 33/505 |
| 11,038,083 B2* | 6/2021 | Singer | H01L 33/486 |
| 2013/0161643 A1* | 6/2013 | Crowder | H01L 33/007 257/77 |
| 2014/0239327 A1* | 8/2014 | Konsek | H01L 33/08 977/762 |
| 2015/0021636 A1* | 1/2015 | Mandl | H01L 33/18 257/88 |

* cited by examiner

ULTRAVIOLET LIGHT-EMITTING DIODE CHIP AND METHOD FOR MAKING THE SAME

CROSS-REFERENCE TO RELAYED APPLICATIONS

This application is a continuation-in-part of International Patent Application No. PCT/CN2019/094986 with an international filing date of Jul. 8, 2019, designating the United States, now pending, and further claims foreign priority benefits to Chinese Patent Application No. 201810765845.8 filed on Jul. 12, 2018, and to Chinese Patent Application No. 201821104745.2 filed on Jul. 12, 2018. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND

The disclosure relates to an ultraviolet (UV) light-emitting diode chip and a method for making the same.

In recent years, a new UV source, ultraviolet light-emitting diode (UV-LED), has emerged with a number of advantages such as environmental friendliness, low power consumption, and low voltage compared to a traditional UV mercury lamp. Aluminum gallium nitride (AlGaN) is the core material of UV light-emitting diodes. However, p-type GaN can absorb UV light. With the increase of the aluminum content and the decrease of the UV wavelength, the light emission of the active layer is converted from the transverse electric (TE) mode polarized light to transverse magnetic (TM) mode polarized light. The propagation direction of the TE mode polarized light is perpendicular to the front surface of the LED, so that the light efficiently penetrates through the semiconductor layer and is emitted. On the contrary, the propagation direction of the TM mode polarized light is parallel to the front surface of the LED, as shown in FIG. 1A; the propagation of the light in the proximity of the active layer travels several hundreds of micrometers before reaching the lateral surface of the LED. In this way, most of the light is absorbed by the active layer. Thus, conventional UV light-emitting diodes have a relatively low light extraction efficiency thereby leading to a low luminous efficiency.

SUMMARY

Provided is an ultraviolet light-emitting diode chip, comprising:
- a n-type semiconductor layer;
- an intermediate layer disposed on the n-type semiconductor layer, the intermediate layer comprising a plurality of first tapered pits;
- an active layer disposed on the intermediate layer;
- a p-type semiconductor layer disposed on the active layer;
- a n-type electrode disposed on the n-type semiconductor layer;
- a p-type electrode disposed on the p-type semiconductor layer;
- a reflecting layer;
- a bonding layer; and
- a substrate.

The reflecting layer and the bonding layer are disposed between the p-type electrode and the substrate; the reflecting layer is attached to the p-type electrode and the bonding layer is attached to the substrate; and the active layer comprises a plurality of second tapered pits each in a shape of hexagonal pyramid and a plurality of first flat regions connecting every two adjacent second tapered pits; the plurality of second tapered pits is disposed in the plurality of first tapered pits, respectively; and a projected area of the plurality of first flat regions is less than 30% of a projected area of the active layer.

In a class of this embodiment, the dominant wavelength of emission of the active layer is less than 365 nm.

In a class of this embodiment, the p-type semiconductor layer comprises a first surface connected to the active layer and a second surface opposite to the first surface, and the second surface comprises a plurality of third tapered pits.

In a class of this embodiment, the second surface further comprises a plurality of second flat regions connecting every two adjacent third tapered pits, and a projected area of the plurality of second flat regions is less than 50% of the projected area of the active layer.

In a class of this embodiment, the p-type semiconductor layer comprises a first surface connected to the active layer and a second surface opposite to the first surface, and the second surface is a flat surface.

In a class of this embodiment, the n-type semiconductor layer is n-type $Al_xGa_{1-x}N$ growing on an epitaxial substrate, where $1 \geq x \geq 0.2$; and the epitaxial substrate is selected from sapphire, silicon carbide, silicon, zinc oxide, aluminum nitride or gallium nitride.

In a class of this embodiment, the n-type semiconductor layer is n-type AlGaN growing on an epitaxial substrate; and the epitaxial substrate is selected from sapphire, silicon carbide, silicon, zinc oxide, aluminum nitride, or gallium nitride.

In a class of this embodiment, the intermediate layer is n-type $Al_xGa_{1-x}N$ growing at a temperature of 700-1000° C. where $1 \geq x \geq 0.1$.

In a class of this embodiment, the intermediate layer is n-type AlGaN.

In a class of this embodiment, the p-type semiconductor layer comprises a p-type $Al_xGa_{1-x}N$ electron blocking layer where $1 \geq x \geq 0.1$ and a p-type GaN contact layer.

In a class of this embodiment, the p-type semiconductor layer comprises a p-type AlGaN electron blocking layer and a p-type GaN contact layer.

In a class of this embodiment, the active layer is a multilayered structure comprising a plurality of quantum well layers of $In_xAl_yGa_{1-x-y}N$ where $0.2 \geq x \geq 0$, $0.8 \geq y \geq 0$ and a plurality of quantum barrier layers of $Al_zGa_{1-z}N$ where $1 \geq Z \geq 0.1$; and the plurality of quantum well layers and the plurality of quantum barrier layers are alternately grown on the active layer.

In a class of this embodiment, the active layer is a multilayered structure comprising a plurality of quantum well layers of InAlGaN and a plurality of quantum barrier layers of AlGaN; and the plurality of quantum well layers and the plurality of quantum barrier layers are alternately grown on the active layer.

In a class of this embodiment, the substrate is a silicon substrate, ceramic substrate, alloy substrate, or printed circuit board (PCB).

Also provided is a method for preparing an ultraviolet light-emitting diode chip, the method comprising:
disposing a n-type semiconductor layer, an intermediate layer comprising a plurality of first tapered pits, an active layer, and a p-type semiconductor layer consecutively in order on an epitaxial substrate;

consecutively disposing a p-type electrode, a reflecting layer, and a bonding layer on the p-type semiconductor layer, thereby yielding a LED precursor;

turning over the LED precursor and bonding the p-type electrode to a substrate by a metal bonding process;

removing the epitaxial substrate to expose the n-type semiconductor layer, and disposing a n-type electrode on the n-type semiconductor layer, thereby yielding an UV light-emitting diode chip.

Further provided is a method for preparing an ultraviolet light-emitting diode chip, the method comprising:

disposing a n-type semiconductor layer, an intermediate layer comprising a plurality of first tapered pits, an active layer, and a p-type semiconductor layer consecutively in order on an epitaxial substrate;

etching the p-type semiconductor layer, the active layer, and the intermediate layer to produce a step thereby partially exposing the n-type semiconductor layer;

disposing a n-type electrode on an exposed part of the n-type semiconductor layer;

consecutively disposing a p-type electrode, a reflecting layer, and a bonding layer on the p-type semiconductor layer, thereby yielding a LED precursor; and turning over the LED precursor, bonding the p-type electrode and the n-type electrode to a substrate by a metal bonding process, thereby yielding an UV light-emitting diode chip.

The n-type semiconductor layer is Si-doped $Al_xGa_{1-x}N$ where $1 \geq x \geq 0.2$, a doping density of Si is $1 \times 10^{18} - 5 \times 10^{20}$ cm$^{-3}$, and a thickness of the n-type semiconductor layer is 1-10 μm.

The intermediate layer is Si-doped $Al_xGa_{1-x}N$ where $1 \geq x \geq 0.1$, a doping density of Si is $5 \times 10^{17} - 1 \times 10^{20}$ cm$^{-3}$, and a thickness of the intermediate layer is 0.1-5 μm; and a density and opening size of the plurality of first tapered pits is subject to a growth temperature, hydrogen concentration in a growing process, and thickness of the intermediate layer.

The active layer is a multilayered structure comprising a plurality of quantum well layers of $In_xAl_yGa_{1-x-y}N$ where $0.2 \geq x \geq 0$, $0.8 \geq y \geq 0$, and $y<z$, and a plurality of quantum barrier layers of $Al_zGa_{1-z}N$ where $1 \geq Z \geq 0.1$; and the plurality of quantum well layers and plurality of quantum barrier layers are alternately grown on the active layer; a growth cycle of the plurality of quantum well layers and the plurality of quantum barrier layers is n where $2<n<15$; the thickness of each quantum well layer is 0.5-5 nm, and the thickness of each quantum barrier layer is 2-20 nm.

The p-type semiconductor layer comprises a p-type $Al_xGa_{1-x}N$ electron blocking layer where $1 \geq x \geq 0.1$ and a p-type GaN contact layer; a thickness of the electron blocking layer is 10-200 nm, and a doping density of magnesium (Mg) is $1 \times 10^{18} - 5 \times 10^{20}$ cm$^{-3}$; a thickness of the p-type GaN contact layer is 10-200 nm, and a doping density of Mg is $1 \times 10^{19} - 5 \times 10^{21}$ cm$^{-3}$.

The reflecting layer is selected from aluminum (Al), silver (Ag), nickel (Ni), titanium (Ti), chromium (Cr), or a combination thereof.

The bonding layer is selected from gold (Au), silver (Ag), aluminum (Al), bismuth (Bi), copper (Cu), zinc (Zn), indium (In), tin (Sn), and nickel (Ni), or a combination thereof.

The substrate is a silicon substrate, ceramic substrate, alloy substrate, or printed circuit board (PCB).

The following advantages are associated with the ultraviolet light-emitting diode chip of the disclosure. The active layer of the ultraviolet light-emitting diode chip comprises a plurality of tapered pits each in a shape of hexagonal pyramid, thereby changing the emergent direction of the TM mode polarized light in the active layer, reducing the propagation of the TM mode polarized light near the active layer. In addition, the density and opening size of the plurality of tapered pits of the active layer are adjustable, so that the projected area of the flat regions connecting the tapered pits is controlled to be less than 30% of the projected area of the active layer, thus improving the light extraction efficiency of the UV light emitting diode.

Figure 1A:
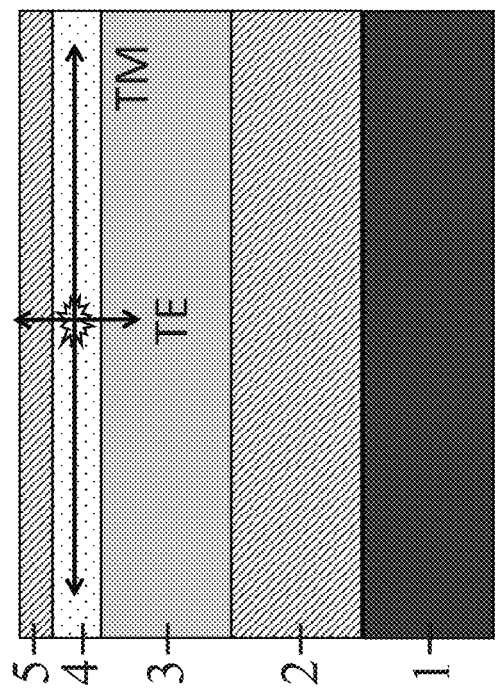
FIG. 1A is a schematic diagram of light propagation in an epitaxial structure in the related art.
Figure 1B:
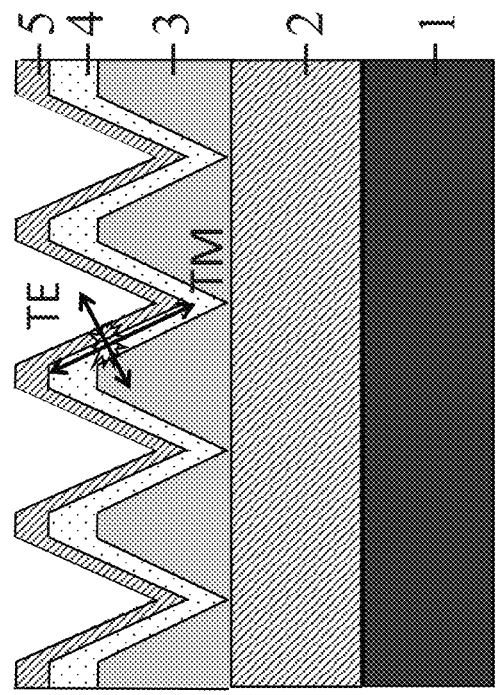
FIG. 1B is a schematic diagram of light propagation in an epitaxial structure according to one embodiment of the disclosure.

In the drawings, the following reference numbers are used: 1. Epitaxial substrate; 2. N-type semiconductor layer; 3. Intermediate layer; 4. Active layer; 5. P-type semiconductor layer; 6. P-type electrode; 7. Reflecting layer; 8. Bonding layer; 9. N-type electrode; 10. Substrate.

DETAILED DESCRIPTIONS

To further illustrate, embodiments detailing an ultraviolet light-emitting diode chip and method for making the same are described below. It should be noted that the following embodiments are intended to describe and not to limit the disclosure.

Example 1

Figure 2:
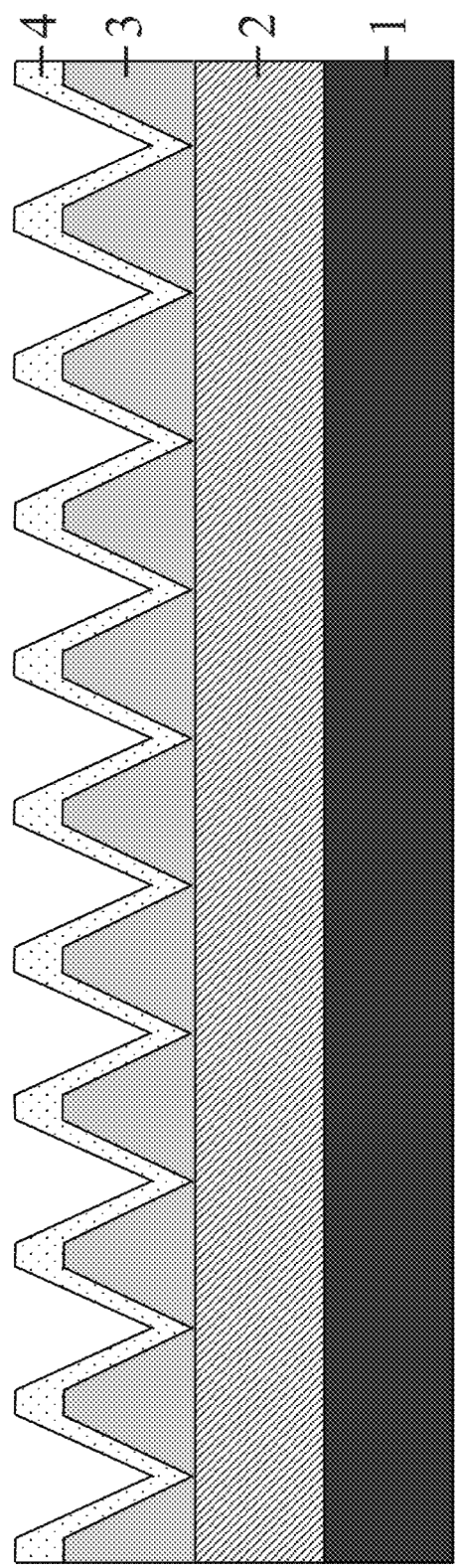
FIG. 2 is a sectional view of an epitaxial structure of an ultraviolet light-emitting diode according to one embodiment of the disclosure.
Figure 3:
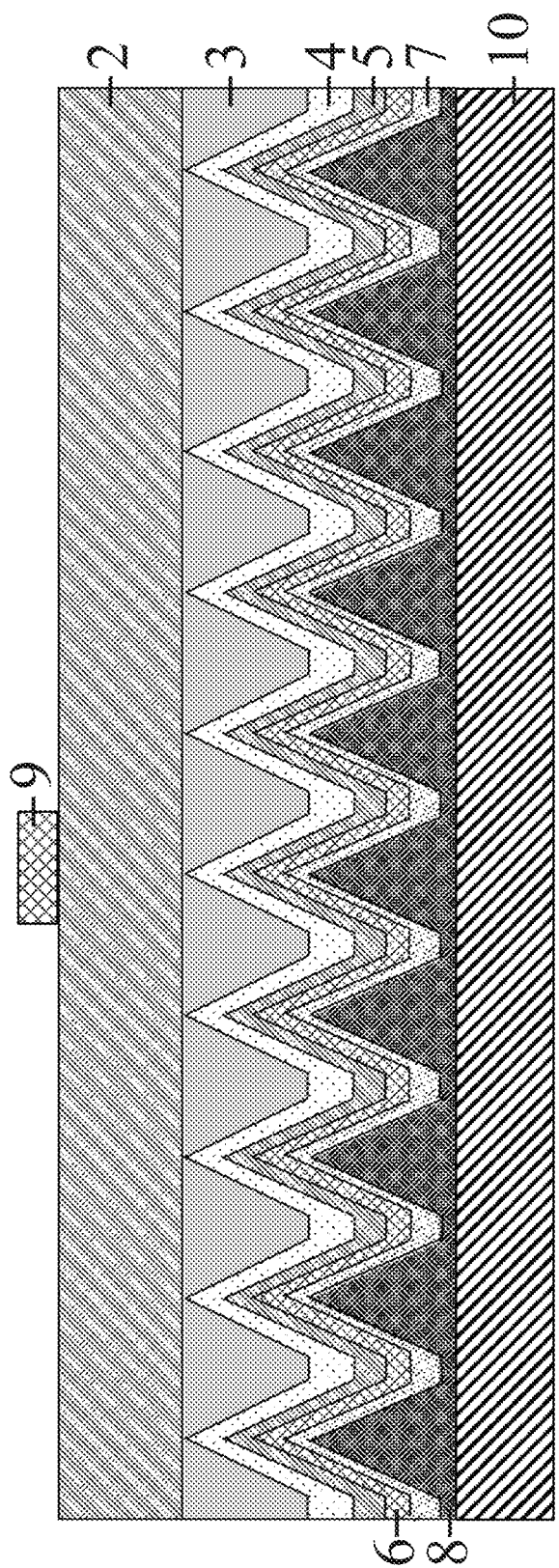
FIG. 3 is a sectional view of an ultraviolet light-emitting diode in Example 1 of the disclosure.

As shown in FIGS. 2-3, the disclosure provides an ultraviolet light-emitting diode chip in a vertical structure, comprising a N-type semiconductor layer 2; an intermediate layer 3; an active layer 4; a p-type semiconductor layer 5; a p-type electrode 6; a reflecting layer 7; a bonding layer 8; a n-type electrode 9; and a substrate 10. The intermediate layer 3 is disposed on the n-type semiconductor layer 2, and comprises a plurality of first tapered pits. The active layer 4 is disposed on the intermediate layer 3; the p-type semiconductor layer 5 is disposed on the active layer 4; the n-type electrode 9 is disposed on the n-type semiconductor layer 2; the p-type electrode 6 is disposed on the p-type semiconductor layer 5. The reflecting layer 7 and the bonding layer 8 are disposed between the p-type electrode 6 and the substrate 10; the reflecting layer 7 is attached to the p-type electrode 6 and the bonding layer 8 is attached to the substrate 10. The active layer 4 comprises a plurality of second tapered pits each in a shape of hexagonal pyramid and a plurality of first flat regions connecting every two adjacent second tapered pits. The plurality of second tapered pits is disposed in the plurality of first tapered pits, respectively. The p-type semiconductor layer 5 comprises a first surface connected to the active layer 4 and a second surface opposite to the first surface, and the second surface comprises a plurality of third tapered pits. The projected area of the plurality of first flat regions is less than 30% of the projected area of the active layer 4.

Specifically, the n-type semiconductor layer 2 is n-type AlGaN growing on an epitaxial substrate 1; and the epitaxial substrate 1 is selected from sapphire, silicon carbide, silicon, zinc oxide, aluminum nitride, or gallium nitride.

Specifically, the p-type semiconductor layer 5 comprises a p-type AlGaN electron blocking layer and a p-type GaN contact layer.

Specifically, the active layer 4 is a multilayered structure comprising a plurality of quantum well layers of InAlGaN and a plurality of quantum barrier layers of AlGaN; and the plurality of quantum well layers and plurality of quantum barrier layers are alternately grown on the active layer.

Specifically, the p-type semiconductor layer 5 comprises an uneven surface and is transferred to the substrate 10 by metal bonding.

Specifically, the substrate 10 is a silicon substrate, ceramic substrate, alloy substrate, or printed circuit board (PCB).

A method for preparing the ultraviolet light-emitting diode chip in a vertical structure is detailed as follows:

1) disposing, through metal organic chemical vapor deposition (MOCVD), the n-type semiconductor layer 2, the intermediate layer 3 comprising a plurality of first tapered pits, the active layer 4, and the p-type semiconductor layer 5 consecutively in order on the epitaxial substrate 1.

In this example, the epitaxial substrate 1 is a sapphire substrate, and the growth of the epitaxial layers is described as follows:

1.1) Growing, through metal organic chemical vapor deposition (MOCVD), the n-type semiconductor layer 2 on the epitaxial substrate 1. The n-type semiconductor layer 2 comprises a buffer layer, a stress release layer, and a n-type doping layer. Specifically, the temperature of the reaction chamber of the MOCVD is controlled at 600° C., the pressure at 100 torr, and an AlN buffer layer having a thickness of 30 nm is grown. Thereafter, the temperature of the reaction chamber is controlled at 1100° C., the pressure at 100 torr, and an $Al_{0.55}Ga_{0.45}N$ stress release layer having a thickness of 2.5 µm is grow. Under the pressure, the temperature of the reaction chamber is controlled at 1300° C., and the Si-doped $Al_{0.55}Ga_{0.45}N$ having a thickness of 2 µm is grow. The doping density of Si is $1\times10^{20}$ $cm^{-3}$.

1.2) Growing the intermediate layer 3 on the n-type semiconductor layer 2. Specifically, the temperature of the reaction chamber is controlled at 825° C. In the presence of 20% (v/v) $H_2$, the intermediate layer 3 comprising Si-doped $Al_{0.55}Ga_{0.45}N$ with a thickness of 0.75 µm is grown at a growth rate of 0.45 µm/h and the Si doping density is $1\times10^{18}$ $cm^{-3}$. During the growth process, a plurality of tapered pits each in a shape of hexagonal pyramid are formed at the dislocation sites of the intermediate layer 3. The density of the tapered pits of the intermediate layer 3 are associated with the temperature and $H_2$ volume percent in the reaction chamber. With the increase of the thickness of the intermediate layer 3, the opening size of the tapered pits becomes larger. Thus, by adjusting the growth temperature, the $H_2$ volume percent, and the thickness of the intermediate layer 3, the density and opening of the tapered pits in the quantum well are adjusted, thereby controlling the area percent of the flat regions connecting the tapered pits of the intermediate layer 3. In certain examples, the projected area of the flat regions is 10% of the projected area of the active layer 4.

1.3) Growing the active layer 4 comprising a plurality of tapered pits each in a shape of hexagonal pyramid on the intermediate layer 3. The active layer 4 comprises five $In_{0.03}Al_{0.45}Ga_{0.52}N$ quantum well layers and five $Al_{0.5}Ga_{0.5}N$ quantum barrier layers alternately grown on the active layer. The growth temperature of the active layer is 1100° C. The thickness of each $In_{0.03}Al_{0.45}Ga_{0.52}N$ quantum well layer is 2 nm, and the thickness of each $Al_{0.5}Ga_{0.5}N$ quantum barrier layer is 5 nm.

1.4) Growing the p-type semiconductor layer 5 on the active layer 4. The p-type semiconductor layer 5 is covered on the active layer 4 and has an appearance similar to that of the active layer. The p-type semiconductor layer 5 comprises a Mg-doped $Al_{0.6}Ga_{0.4}N$ electron barrier layer and a Mg-doped GaN contact layer. Specifically, the temperature of the reaction chamber is controlled at 1150° C., the pressure at 100 torr, and a Mg-doped $Al_{0.6}Ga_{0.4}N$ electron barrier layer having a thickness of 35 nm is grown. The doping density of Mg is $1\times10^{19}$ $cm^{-3}$. Thereafter, the temperature of the reaction chamber is controlled at 960° C., the pressure at 100 torr, and a Mg-doped GaN contact layer having a thickness of 20 nm is grown. The doping density of Mg is $1\times10^{20}$ $cm^{-3}$.

Optionally, in another aspect, the epitaxial substrate 1 is a sapphire substrate; the n-type semiconductor layer 2 and the intermediate layer 3 are n-type AlGaN. The intermediate layer 3 comprises a plurality of tapered pits growing at a temperature of 700-1000° C. With the increase of the thickness of the intermediate layer 3, the opening of the tapered pits gradually grows up. The opening size of the tapered pits can be adjusted by adjusting the thickness of the intermediate layer 3. Thereafter, the active layer 4 and the p-type semiconductor layer 5 are consecutively grown on the side of the plurality of tapered pits of the intermediate layer 3. Five InAlGaN quantum well layers and five AlGaN quantum barrier layers are alternately grown on the active layer. The p-type semiconductor layer 5 comprises a p-type AlGaN electron barrier layer and a p-type GaN contact layer.

2) Consecutively growing, through evaporation or sputtering process, the p-type electrode 6, the reflecting layer 7, and the bonding layer 8 on the p-type semiconductor layer 5. The ultraviolet light-emitting diode is overturned and bonded to the substrate 10 through a metal bonding process. In this example, the p-type electrode 6 is Ni/Au, the reflecting layer 7 is Al, the bonding layer 8 is AuSn, and the substrate 10 is a Si substrate.

3) One side of the sapphire substrate 1 is radiated by an excimer laser so as to remove the sapphire substrate 1 and expose the n-type semiconductor layer 2. The n-type electrode 9 is disposed on the exposed n-type semiconductor layer 2 thereby forming the UV light-emitting diode chip in a vertical structure as shown in FIG. 3. The UV light-emitting diode chip has an emission wavelength of 290 nm. In this example, the wavelength of the excimer laser is 193 nm, and the n-type electrode 9 is Ni/Au.

Example 2

Figure 4:
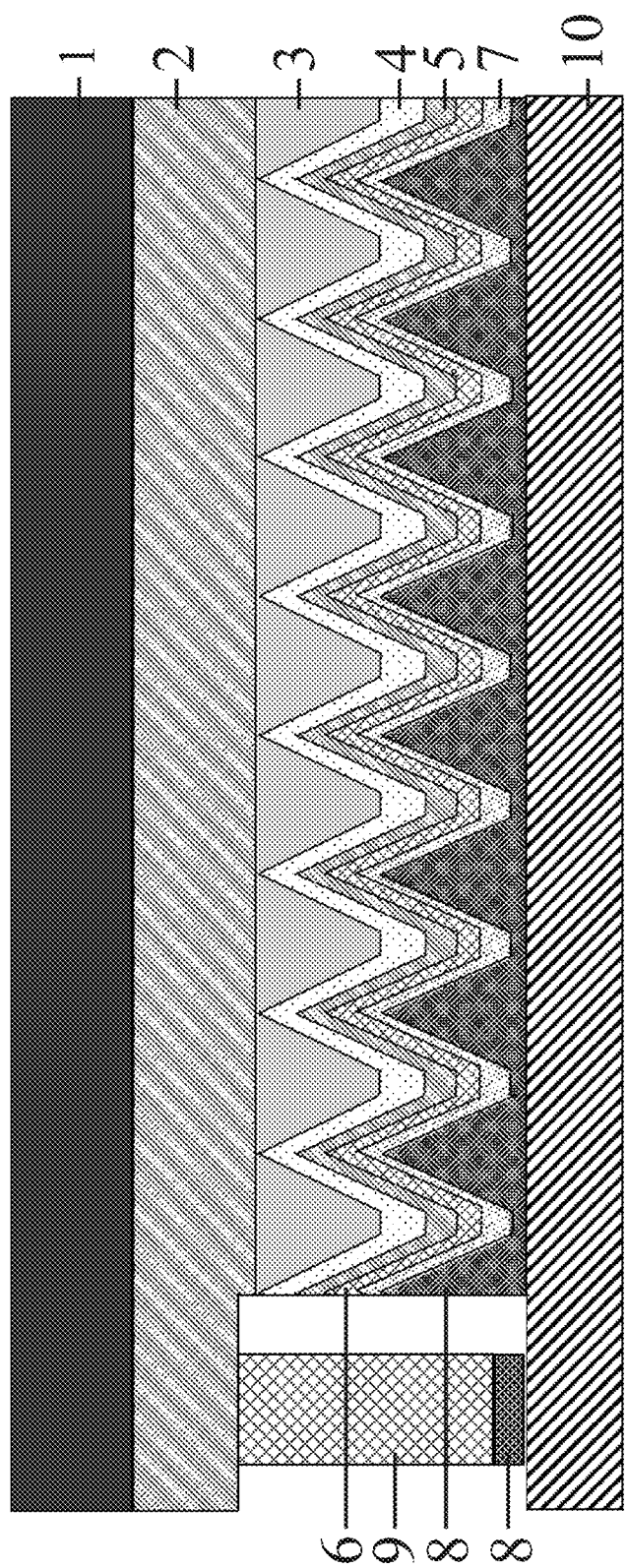
FIG. 4 is a sectional view of an ultraviolet light-emitting diode in Example 2 of the disclosure.

As shown in FIG. 2 and FIG. 4, the disclosure provides an ultraviolet light-emitting diode chip in an inverted structure, comprising a N-type semiconductor layer 2; an intermediate layer 3; an active layer 4; a p-type semiconductor layer 5; a p-type electrode 6; a reflecting layer 7; a bonding layer 8; a n-type electrode 9; and a substrate 10. The intermediate layer 3 is disposed on the n-type semiconductor layer 2, and comprises a plurality of first tapered pits. The active layer 4 is disposed on the intermediate layer 3; the p-type semiconductor layer 5 is disposed on the active layer 4; the n-type electrode 9 is disposed on the n-type semiconductor layer 2;

the p-type electrode 6 is disposed on the p-type semiconductor layer 5. The reflecting layer 7 and the bonding layer 8 are disposed between the p-type electrode 6 and the substrate 10; the reflecting layer 7 is attached to the p-type electrode 6 and the bonding layer 8 is attached to the substrate 10. The active layer 4 comprises a plurality of second tapered pits each in a shape of hexagonal pyramid and a plurality of first flat regions connecting every two adjacent second tapered pits. The plurality of second tapered pits is disposed in the plurality of first tapered pits, respectively. The p-type semiconductor layer 5 comprises a first surface connected to the active layer 4 and a second surface opposite to the first surface, and the second surface comprises a plurality of third tapered pits. The projected area of the plurality of first flat regions is less than 30% of the projected area of the active layer 4.

A method for preparing the ultraviolet light-emitting diode chip in an inverted structure is detailed as follows:

1) growing, through metal organic chemical vapor deposition (MOCVD), the n-type semiconductor layer 2, the intermediate layer 3, the active layer 4, and the p-type semiconductor layer 5 consecutively in order on the epitaxial substrate 1, as shown in FIG. 2;

2) etching, through dry etching process under yellow light atmosphere, the p-type semiconductor layer 5, the active layer 4, and the intermediate layer 3 to produce a step thereby partially exposing the n-type semiconductor layer 2, and disposing the n-type electrode 9 on the exposed part of the n-type semiconductor layer 2;

3) consecutively disposing the p-type electrode 6 and the reflecting layer 7 on the p-type semiconductor layer 5; disposing the bonding layer 8 on the reflecting layer 7 and the n-type electrode 9; and turning over and bonding the UV light-emitting diode to the substrate 10, thereby forming the ultraviolet light-emitting diode chip in an inverted structure as shown in FIG. 4. The ultraviolet light-emitting diode chip has an emission wavelength of 285 nm.

Example 3

Figure 5:
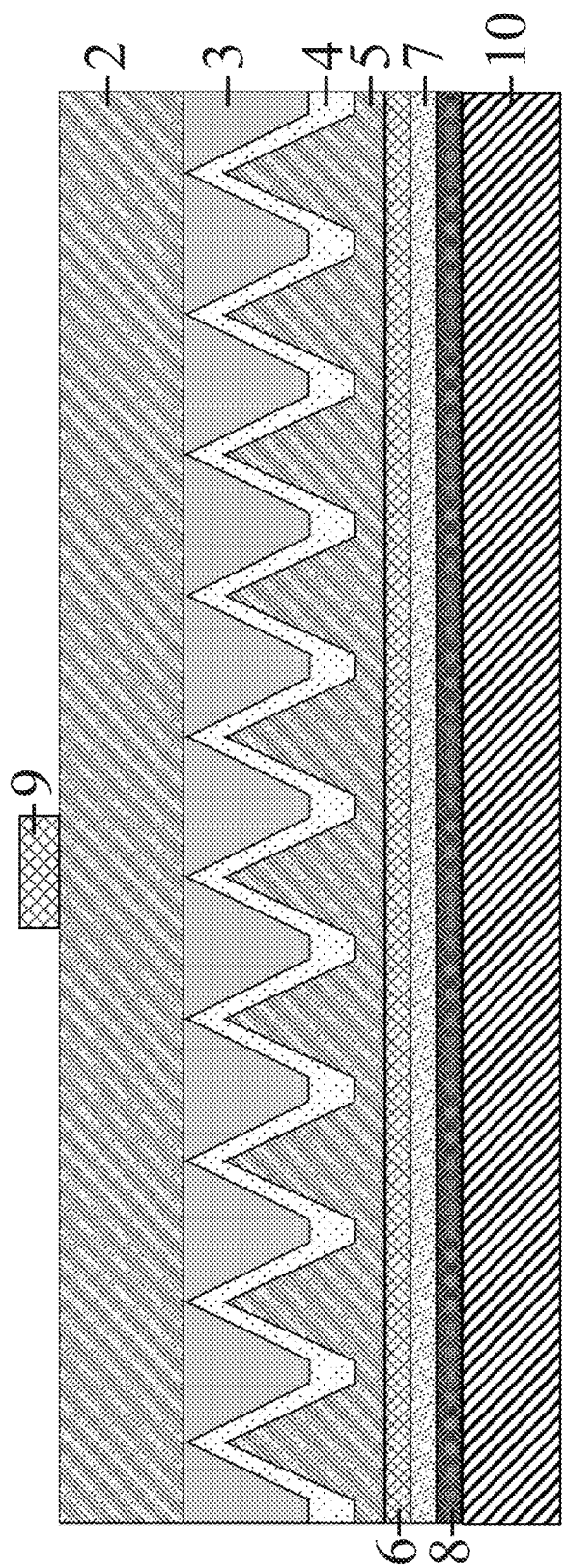
FIG. 5 is a sectional view of an ultraviolet light-emitting diode in Example 3 of the disclosure.

As shown in FIG. 2 and FIG. 5, the disclosure provides an ultraviolet light-emitting diode chip in a vertical structure which is basically the same as that in Example 1 except that the p-type semiconductor layer 5 comprises a first surface connected to the active layer 4 and a second surface opposite to the first surface, and the second surface is a flat surface. That is, by adjusting the growth condition and the thickness of p-type semiconductor layer, the tapered pits of the active layer 4 are filled with the p-type semiconductor layer 5, so that the surfaces of the subsequent epitaxial layers are flat. The ultraviolet light-emitting diode chip in a vertical structure, as shown in FIG. 5, has an emission wavelength of 285 nm.

It will be obvious to those skilled in the art that changes and modifications may be made, and therefore, the aim in the appended claims is to cover all such changes and modifications.

What is claimed is:

1. A device, comprising:
   a n-type semiconductor layer;
   an intermediate layer disposed on the n-type semiconductor layer, the intermediate layer comprising a plurality of first tapered pits, the plurality of first tapered pits being each in a shape of hexagonal pyramid;
   an active layer disposed on the intermediate layer;
   a p-type semiconductor layer disposed on the active layer;
   a n-type electrode disposed on the n-type semiconductor layer;
   a p-type electrode disposed on the p-type semiconductor layer;
   a reflecting layer;
   a bonding layer; and
   a substrate;
   wherein:
   a dominant wavelength of emission of the active layer is less than 365 nm; and
   the reflecting layer and the bonding layer are disposed between the p-type electrode and the substrate; the reflecting layer is attached to the p-type electrode and the bonding layer is attached to the substrate; and
   the active layer comprises a plurality of second tapered pits each in a shape of hexagonal pyramid and a plurality of first flat regions connecting every two adjacent second tapered pits; the plurality of second tapered pits is disposed in the plurality of first tapered pits, respectively; and a projected area of the plurality of first flat regions is less than 30% of a projected area of the active layer, wherein the n-type semiconductor layer comprises a first partially exposed surface toward the substrate; the substrate comprises a second partially exposed surface toward the n-type semiconductor layer; the n-type electrode is in a pillar shape comprising a first pillar end and a second pillar end; and the first pillar end is disposed on the first partially exposed surface, and the second pillar end is connected to a portion of the bonding layer disposed on the second partially exposed surface.

2. The device of claim 1, wherein the p-type semiconductor layer comprises a first surface connected to the active layer and a second surface opposite to the first surface, and the second surface comprises a plurality of third tapered pits.

3. The device of claim 2, wherein the second surface further comprises a plurality of second flat regions connecting every two adjacent third tapered pits, and a projected area of the plurality of second flat regions is less than 50% of the projected area of the active layer.

4. The device of claim 1, wherein the p-type semiconductor layer comprises a first surface connected to the active layer and a second surface opposite to the first surface, and the second surface is a flat surface.

5. The device of claim 1, wherein the n-type semiconductor layer is n-type $Al_xGa_{1-x}N$ growing on an epitaxial substrate, where $1 \geq x \geq 0.2$; and the epitaxial substrate is selected from sapphire, silicon carbide, silicon, zinc oxide, aluminum nitride or gallium nitride.

6. The device of claim 1, wherein the n-type semiconductor layer is n-type AlGaN growing on an epitaxial substrate; and the epitaxial substrate is selected from sapphire, silicon carbide, silicon, zinc oxide, aluminum nitride, or gallium nitride.

7. The device of claim 1, wherein the intermediate layer is n-type $Al_xGa_{1-x}N$ growing at a temperature of 700-1000° C. where $1 \geq x \geq 0.1$.

8. The device of claim 1, wherein the p-type semiconductor layer comprises a p-type $Al_xGa_{1-x}N$ electron blocking layer where $1 \geq x \geq 0.1$ and a p-type GaN contact layer.

9. The device of claim 1, wherein the active layer is a multilayered structure comprising a plurality of quantum well layers of $In_xAl_yGa_{1-x-y}N$ where $0.2 \geq x \geq 0$, $0.8 \geq y \geq 0$ and a plurality of quantum barrier layers of $Al_zGa_{1-z}N$ where $1 \geq Z \geq 0.1$; and the plurality of quantum well layers and the plurality of quantum barrier layers are alternately grown on the active layer.

10. The device of claim 1, wherein the substrate is a silicon substrate, ceramic substrate, alloy substrate, or printed circuit board (PCB).

11. A method, comprising:
disposing, through metal organic chemical vapor deposition (MOCVD), a n-type semiconductor layer, an intermediate layer comprising a plurality of first tapered pits, an active layer, and a p-type semiconductor layer consecutively in order on an epitaxial substrate;
consecutively disposing a p-type electrode, a reflecting layer, and a bonding layer on the p-type semiconductor layer, thereby yielding a LED precursor;
turning over the LED precursor and bonding the p-type electrode to a substrate by a metal bonding process; and
removing the epitaxial substrate to expose the n-type semiconductor layer, and disposing a n-type electrode on the n-type semiconductor layer, thereby yielding an UV light-emitting diode chip;
wherein:
a dominant wavelength of emission of the active layer is less than 365 nm; and
the active layer comprises a plurality of second tapered pits each in a shape of hexagonal pyramid and a plurality of first flat regions connecting every two adjacent second tapered pits; the plurality of second tapered pits is disposed in the plurality of first tapered pits, respectively; and a projected area of the plurality of first flat regions is less than 30% of a projected area of the active layer, wherein the n-type semiconductor layer comprises a first partially exposed surface toward the substrate; the substrate comprises a second partially exposed surface toward the n-type semiconductor layer; the n-type electrode is in a pillar shape comprising a first pillar end and a second pillar end; and the first pillar end is disposed on the first partially exposed surface, and the second pillar end is connected to a portion of the bonding layer disposed on the second partially exposed surface.

12. The method of claim 11, wherein the n-type semiconductor layer is Si-doped $Al_xGa_{1-x}N$ where $1 \geq x \geq 0.2$, a doping density of Si is $1 \times 10^{18}$-$5 \times 10^{20}$ cm$^{-3}$, and a thickness of the n-type semiconductor layer is 1-10 μm; and the intermediate layer is Si-doped $Al_xGa_{1-x}N$ where $1 \geq x \geq 0.1$, a doping density of Si is $5 \times 10^{17}$-$1 \times 10^{20}$ cm$^{-3}$, and a thickness of the intermediate layer is 0.1-5 μm.

13. The method of claim 11, wherein the active layer is a multilayered structure comprising a plurality of quantum well layers of $In_xAl_yGa_{1-x-y}N$ where $0.2 \geq x \geq 0$, $0.8 \geq y \geq 0$, and y<z, and a plurality of quantum barrier layers of $Al_zGa_{1-z}N$ where $1 \geq Z \geq 0.1$; and the plurality of quantum well layers and the plurality of quantum barrier layers are alternately grown on the active layer; a growth cycle of the plurality of quantum well layers and the plurality of quantum barrier layers is n where 2<n<15; a thickness of each quantum well layer is 0.5-5 nm, and a thickness of each quantum barrier layer is 2-20 nm.

14. The method of claim 11, wherein the p-type semiconductor layer comprises a p-type $Al_xGa_{1-x}N$ electron blocking layer where $1 \geq x \geq 0.1$ and a p-type GaN contact layer; a thickness of the electron blocking layer is 10-200 nm, and a doping density of magnesium (Mg) is $1 \times 10^{18}$-$5 \times 10^{20}$ cm$^{-3}$; a thickness of the p-type GaN contact layer is 10-200 nm, and a doping density of Mg is $1 \times 10^{19}$-$5 \times 10^{21}$ cm$^{-3}$.

15. The method of claim 11, wherein the reflecting layer is selected from aluminum (Al), silver (Ag), nickel (Ni), titanium (Ti), chromium (Cr), or a combination thereof; and the bonding layer is selected from gold (Au), silver (Ag), aluminum (Al), bismuth (Bi), copper (Cu), zinc (Zn), indium (In), tin (Sn), and nickel (Ni), or a combination thereof; and the substrate is a silicon substrate, ceramic substrate, alloy substrate, or printed circuit board (PCB).

16. A method, comprising:
disposing, through metal organic chemical vapor deposition (MOCVD), a n-type semiconductor layer, an intermediate layer comprising a plurality of first tapered pits, an active layer, and a p-type semiconductor layer consecutively in order on an epitaxial substrate;
etching the p-type semiconductor layer, the active layer, and the intermediate layer to produce a step thereby partially exposing the n-type semiconductor layer;
disposing a n-type electrode on an exposed part of the n-type semiconductor layer;
consecutively disposing a p-type electrode, a reflecting layer, and a bonding layer on the p-type semiconductor layer, thereby yielding a LED precursor; and
turning over the LED precursor, bonding the p-type electrode and the n-type electrode to a substrate by a metal bonding process, thereby yielding an UV light-emitting diode chip;
wherein:
a dominant wavelength of emission of the active layer is less than 365 nm; and
the active layer comprises a plurality of second tapered pits each in a shape of hexagonal pyramid and a plurality of first flat regions connecting every two adjacent second tapered pits; the plurality of second tapered pits is disposed in the plurality of first tapered pits, respectively; and a projected area of the plurality of first flat regions is less than 30% of a projected area of the active layer, wherein the n-type semiconductor layer comprises a first partially exposed surface toward the substrate; the substrate comprises a second partially exposed surface toward the n-type semiconductor layer; the n-type electrode is in a pillar shape comprising a first pillar end and a second pillar end; and the first pillar end is disposed on the first partially exposed surface, and the second pillar end is connected to a portion of the bonding layer disposed on the second partially exposed surface.

17. The method of claim 16, wherein the n-type semiconductor layer is Si-doped $Al_xGa_{1-x}N$ where $1 \geq x \geq 0.2$, a doping density of Si is $1 \times 10^{18}$-$5 \times 10^{20}$ cm$^{-3}$, and a thickness of the n-type semiconductor layer is 1-10 μm; and the intermediate layer is Si-doped $Al_xGa_{1-x}N$ where $1 \geq x \geq 0.1$, a doping density of Si is $5 \times 10^{17}$-$1 \times 10^{20}$ cm$^{-3}$, and a thickness of the intermediate layer is 0.1-5 μm.

18. The method of claim 16, wherein the active layer is a multilayered structure comprising a plurality of quantum well layers of $In_xAl_yGa_{1-x-y}N$ where $0.2 \geq x \geq 0$, $0.8 \geq y \geq 0$, and y<z, and a plurality of quantum barrier layers of $Al_zGa_{1-z}N$ where $1 \geq Z \geq 0.1$; and the plurality of quantum well layers and the plurality of quantum barrier layers are alternately grown on the active layer; a growth cycle of the plurality of quantum well layers and the plurality of quantum barrier layers is n where 2<n<15; a thickness of each quantum well layer is 0.5-5 nm, and a thickness of each quantum barrier layer is 2-20 nm.

19. The method of claim 16, wherein the p-type semiconductor layer comprises a p-type $Al_xGa_{1-x}N$ electron blocking layer where $1 \geq x \geq 0.1$ and a p-type GaN contact layer; a thickness of the electron blocking layer is 10-200 nm, and a doping density of magnesium (Mg) is $1 \times 10^{18}$-$5 \times$ $10^{20}$ cm$^{-3}$; a thickness of the p-type GaN contact layer is 10-200 nm, and a doping density of Mg is $1\times10^{19}$-$5\times10^{21}$ cm$^{-3}$.

20. The method of claim 16, wherein the reflecting layer is selected from aluminum (Al), silver (Ag), nickel (Ni), titanium (Ti), chromium (Cr), or a combination thereof; and the bonding layer is selected from gold (Au), silver (Ag), aluminum (Al), bismuth (Bi), copper (Cu), zinc (Zn), indium (In), tin (Sn), and nickel (Ni), or a combination thereof; and the substrate is a silicon substrate, ceramic substrate, alloy substrate, or printed circuit board (PCB).

21. The device of claim 1, wherein the n-type semiconductor layer comprises a buffer layer, a stress release layer, and a n-type doping layer.

22. The device of claim 11, wherein the n-type semiconductor layer comprises a buffer layer, a stress release layer, and a n-type doping layer.

23. The device of claim 16, wherein the n-type semiconductor layer comprises a buffer layer, a stress release layer, and a n-type doping layer.

\* \* \* \* \*